United States Patent
Dunphy et al.

(10) Patent No.: US 6,979,893 B2
(45) Date of Patent: Dec. 27, 2005

(54) PACKAGED MICROELECTROMECHANICAL DEVICE WITH LUBRICANT

(75) Inventors: Jim Dunphy, San Jose, CA (US); Dmitri Simonian, Sunnyvale, CA (US); John Porter, Berkeley, CA (US)

(73) Assignee: Reflectivity, Inc, Sunnyvale, CA (US)

( * ) Notice: Subject to any disclaimer, the term of this patent is extended or adjusted under 35 U.S.C. 154(b) by 11 days.

(21) Appl. No.: 10/811,449

(22) Filed: Mar. 26, 2004

(65) Prior Publication Data

US 2005/0214970 A1 Sep. 29, 2005

(51) Int. Cl.[7] .............................................. H01L 23/20
(52) U.S. Cl. ...................... 257/682; 257/721; 438/115; 438/116
(58) Field of Search ......... 257/682, 721; 438/115–116

(56) References Cited

U.S. PATENT DOCUMENTS

| | | | |
|---|---|---|---|
| 5,287,096 A | 2/1994 | Thompson et al. | |
| 5,411,769 A | 5/1995 | Hornbeck | |
| 5,447,600 A | 9/1995 | Webb | |
| 5,512,374 A | 4/1996 | Wallace et al. | |
| 5,610,438 A | 3/1997 | Wallace et al. | |
| 5,694,740 A | 12/1997 | Martin et al. | |
| 5,835,256 A | 11/1998 | Huibers | |
| 5,936,758 A | 8/1999 | Fisher et al. | |
| 5,939,785 A | 8/1999 | Klonis et al. | |
| 6,046,840 A | 4/2000 | Huibers | |
| 6,086,726 A | 7/2000 | Renk et al. | |
| 6,204,085 B1 | 3/2001 | Strumpell et al. | |
| 6,259,551 B1 | 7/2001 | Jacobs | |
| 6,300,294 B1 * | 10/2001 | Robbins et al. ............. | 508/524 |
| 6,475,570 B2 | 11/2002 | Jacobs | |
| 6,664,779 B2 * | 12/2003 | Lopes et al. ............. | 324/158.1 |
| 6,844,959 B2 | 1/2005 | Huibers et al. | |
| 6,867,897 B2 | 3/2005 | Patel et al. | |
| 2002/0056898 A1 | 5/2002 | Lopes et al. | |
| 2002/0063322 A1 | 5/2002 | Robbins et al. | |
| 2003/0002019 A1 | 1/2003 | Miller | |
| 2003/0064149 A1 | 4/2003 | Miller | |
| 2004/0012838 A1 | 1/2004 | Huibers | |
| 2004/0100594 A1 | 5/2004 | Huibers et al. | |
| 2004/0100677 A1 | 5/2004 | Huibers et al. | |
| 2004/0125346 A1 | 7/2004 | Huibers | |
| 2004/0156090 A1 | 8/2004 | Patel et al. | |

OTHER PUBLICATIONS

"Lubrication of Digital Micromirror Devices" Henck, Tribology Letters 3 (1997) 239-247.

Micromotor Operation in a Liquid Environment Dhuler, IEEE 1992 pp. 10-13.

"Optimization of Lubricants fir silica Micromotors" Zarrd, Sensors and Actuators A 46-47 (1995) 598-600.

"Fabrication of packaged thin beam structures by an improved driving method"Masato Ohtsu, IEEE (1996) 0-7803-2985-6, pp. 228-233.

"Operation of electrostatic micromotors in liquid environments" Mehran Mehregany, J. Micromech. Microeng. 2 (1992) 1-3.

"Nanotribology and nanomechanics of MEMS devices", Nharad Bhushan, IEEE0-7803-298-5-6, pp. 91-98.

(Continued)

*Primary Examiner*—Dung A. Le
(74) *Attorney, Agent, or Firm*—Gregory R. Muir

(57) ABSTRACT

The present invention provides a lubricant container inside a microelectromechanical device package. The lubricant container contains selected lubricant that evaporates from the container and contact to a surface of the microelectromechanical device for lubricating the surface.

30 Claims, 4 Drawing Sheets

OTHER PUBLICATIONS

"Micromotor dynamics in lubricating fluids"Keren Deng, J. Micromech. Microeng. 4 (1994) 266-269.

"Stiction reduction processes for surface mciromachines" Roya Maboudian Tribology letters 3 (1997) 215-221.

"Friction and Pull-off Force on Silicon Surface Modified by FIB" Ando IEEE 1996, 0-7803-2985-6/96, pp. 349-353.

"Measurement of Micromoto Dynamics in Lubricating Fluids" Deng IEEE.

"Friction and Wear studies on Lubricants and materials Applicable to MEMS" Shigehisa Suzuki, IEEE 1991, pp. 143-147.

W. Robert Ashurst, et al., Wafer Level Anti-Stiction Coatings for MEMS., Sensors and Actuators A 104 (2003), pp. 213-221.

W. Robert Ashurst et al., Vapor Phase Anti-Stiction Coatings for MEMS, pp. 1-6.

W. Robert Ashurst, et al., Nanometer-Thin Titania Films with Sam-Level Sticktion and Superior Wear Resisitance for Reliable MEMS Performance, 4 pgs.

B.C. Bunker, et al., The Impact of Solution Agglomeration on the Deposition of Self-Assembled Monolayers, 2000 American Chemical Society, pp. 7742-7751.

W. Robert Ashurst, et al., Alkene Based Monolayer Films as Anti-Stiction Coatings for Polysilicon MEMS, Berkeley Sensor & Actuator Center, 4 pgs.

S Imad-Uddin Ahmed, et al., Using Self Assembled Monolayers to Reduce Friction and Wear in Polysilicon Based MEMS, 2000, pp. 1-18.

Uthara Srinivasan, et al., Self Addressed Fluorocarbon Films for Enhanced Stiction Reduction, 1997 ieee, pp. 1399-1402.

* cited by examiner

PACKAGED MICROELECTROMECHANICAL DEVICE WITH LUBRICANT

TECHNICAL FIELD OF THE INVENTION

The present invention is related generally to the art of microstructure, and, more particularly, to lubricating surfaces of the microstructures.

BACKGROUND OF THE INVENTION

Microstructures, such as microelectromechanical devices, have many applications in basic signal transduction. For example, a spatial light modulator based on a microelectromechanical device steers light in response to electrical or optical signals. Such a modulator can be a part of a communication device or an information display.

A major factor that limits the reliability and widespread use of microelectromechanical devices is adhesion. Adhesion is a result of the dominance of surface and interfacial forces, such as capillary, chemical bonding, electrostatic, and van der Waals forces, over mechanical forces which tend to separate microelectromechanical components. When mechanical restoring forces cannot overcome adhesive forces, the microelectromechanical devices are said to suffer from stiction. Stiction failures in contacting microstructures, such as micromirror devices, can occur after the first contacting event (often referred to as initial stiction), or as a result of repeated contacting events (often referred to as in-use stiction). Initial stiction is often associated with surface contamination (e.g., residues of bonding materials or photoresist), or with high energy of contacting surfaces (e.g., clean oxidized silicon or metallic surfaces). For the case of in-use stiction, each time one part of the microstructure (e.g. mirror plate of a micromirror device) touches the other (e.g. stopping mechanism) or the substrate, the contact force grows and ultimately becomes too large for the restoring force to overcome. In this case, the device remains in one state indefinitely. This phenomenon can arise from a variety of underlying mechanisms, such as contact area growth, creation of high-energy surface by micro-wear, surface charge separation etc. An approach to reduce stiction is to lubricate surfaces of microstructures.

SUMMARY OF THE INVENTION

In an embodiment of the invention, a method for lubricating a surface of a microelectromechanical device is disclosed. The method comprises: attaching the microelectromechanical device to a package substrate; disposing a container containing a lubricant proximate to the device on the package substrate, wherein the containing has an opening for allowing the lubricant to evaporate from inside the container to the surface of the device; and sealing the package substrate with a package cover.

In another embodiment of the invention, a method for lubricating a surface of a microelectromechanical device is disclosed. The method comprises: preparing a capillary tubing containing a lubricant that evaporates from one opening-end of the capillary tubing; placing the prepared capillary tubing into a package having the microelectromechanical device such that the lubricant evaporated from the opening-end of the capillary tubing contact to the surface to be lubricated; and sealing the package.

In yet another embodiment of the invention, a microelectromechanical package is provided. The package comprises: a package substrate; a microelectromechanical device having a surface to be lubricated, wherein the microelectromechanical device is disposed on the package substrate; a container containing a lubricant that evaporates from an opening of the container and contacts the surface to be lubricated; and a package cover that is bonded to the package substrate for sealing the package.

In yet another embodiment of the invention, a microelectromechanical package is provided. The package comprises: a package substrate; a microelectromechanical device having a surface to be lubricated, wherein the microelectromechanical device is disposed on the package substrate; a capillary tubing containing a volatile lubricant that evaporates from an opening-end of the capillary tubing and contacts the surface to be lubricated; and a package cover that is bonded to the package substrate.

BRIEF DESCRIPTION OF DRAWINGS

While the appended claims set forth the features of the present invention with particularity, the invention, together with its objects and advantages, may be best understood from the following detailed description taken in conjunction with the accompanying drawings of which:

DETAILED DESCRIPTION OF THE EMBODIMENTS

The present invention provides a method and apparatus for lubricating surfaces of microelectromechanical devices package by placing a container having selected lubricant in the package in which the microelectromechanical device is disposed. The lubricant evaporates from an opening of the container and contacts the surfaces to be lubricated. When the amount of the lubricant is in the micro liter order and needs to be precisely controlled, the container can be a capillary tubing with an interior volume generally equal to the desired amount. The capillary tubing is placed on the package substrate on which the microelectromechanical device is disposed. The lubricant inside the capillary tubing evaporates from an opening of the tubing and contacts the target surfaces. The container having the lubricant can be placed on the package substrate before sealing the package.

The container may also be placed within the microelectromechanical device if the container has a compatible dimension. The lubricant can be mixed with a selected diluent for improving the precise control of the amount of the lubricant and meanwhile, expediting the transportation of the lubricant from inside the container to the target surfaces.

Figure 1:
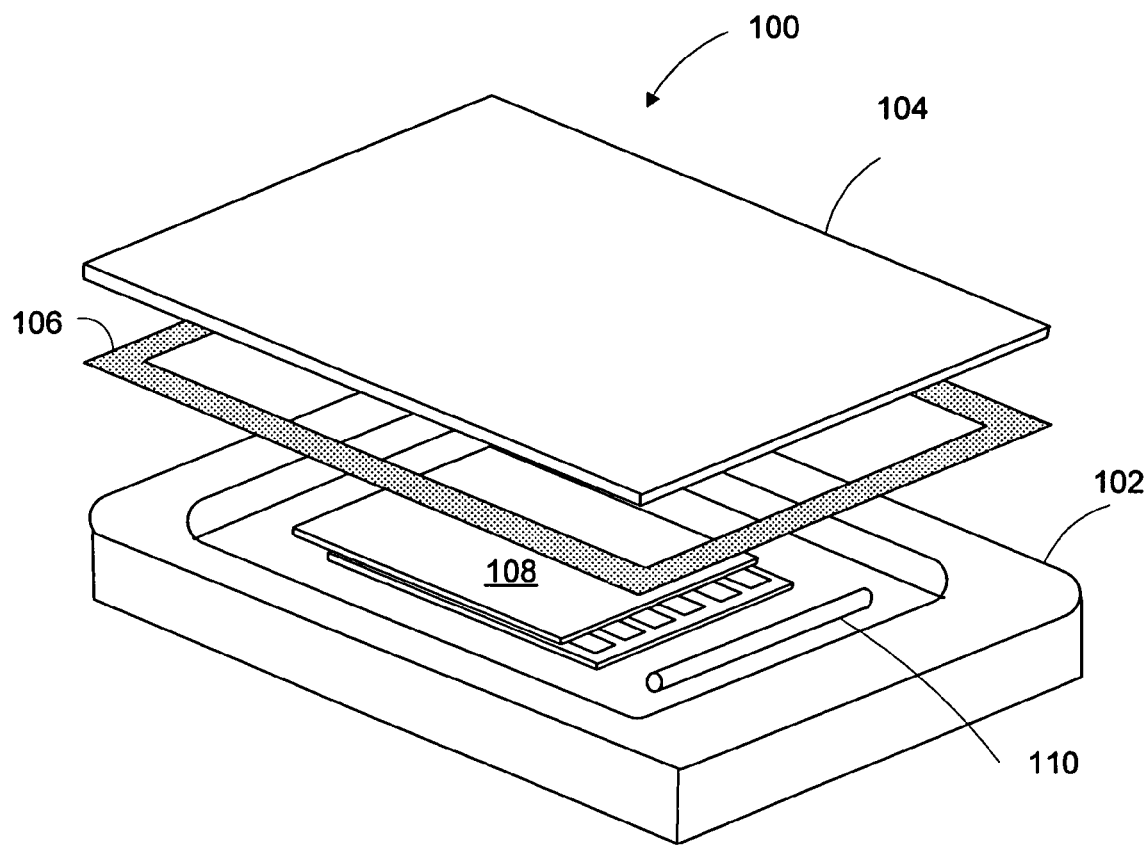
FIG. 1 is a perspective view of an exemplary microelectromechanical device package having a microelectromechanical device and a container that comprises a lubricant according to an embodiment of the invention.

Turning to the drawings, FIG. 1 illustrates a perspective view of an exemplary microelectromechanical device package. Microelectromechanical device package 100 comprises microelectromechanical device 108 attached to package substrate 102. The package substrate may take any desired shapes and forms; and may comprise any suitable materials. In this particular example, the package substrate is ceramic and has a cavity in which the microelectromechanical device can be disposed. Lubricant container 110 is placed on the package substrate at a location proximate to the microelectromechanical device as shown in the figure. The container contains a lubricant that evaporates from the container to the surface of the microelectromechanical device for lubricating the surface. In order to seal the package, package cover 104 is provided and sealing material 106 is disposed between, the package substrate and the package cover for bonding the package substrate and the package cover. The sealing material can be deposited on the top surface of the package substrate or on the bottom surface of the package cover, or alternatively, on both.

Figure 2:
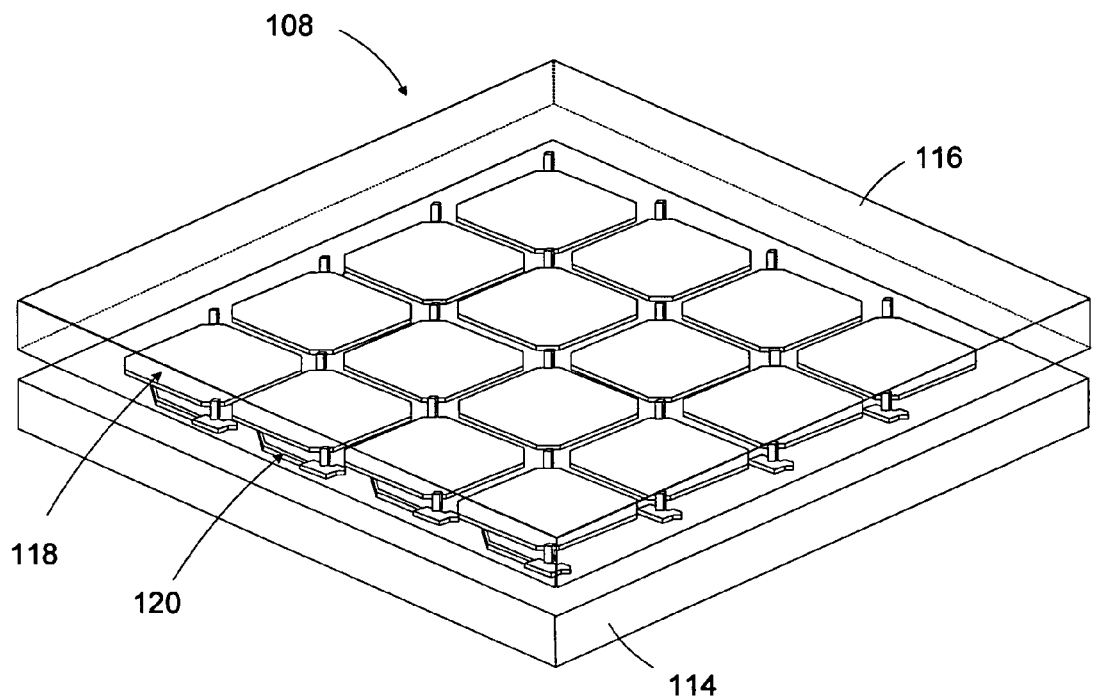
FIG. 2 is a perspective view an exemplary micromirror array device.

The microelectromechanical device can be of a variety of types, such as micromirrors, micromirror array devices, micro-engines, micro-sensors and micro-actuators. As a way of example, a portion of an exemplary micromirror array device is illustrated in FIG. 2. Referring to FIG. 2, micromirror array device 108 comprises an array of reflective deflectable micromirrors 118 formed on substrate 116 which is visible light transmissive glass. For deflecting the micromirrors, an array of electrodes and circuitry is formed on a standard semiconductor substrate 114. In operation, the micromirrors of the array are individually deflected by the electrostatic fields between the mirror plates of the micromirrors and the electrodes. The micromirrors reflect incident light (from a light source) onto different spatial directions in accordance with input signals, such as image signals. The substrates 114 and 116 are often bonded into an assembly using a sealing material between the substrates. The sealing material may form a ring around the circumference of the substrates with the ring having an opening for allowing the lubricant to flow through.

Figure 3:
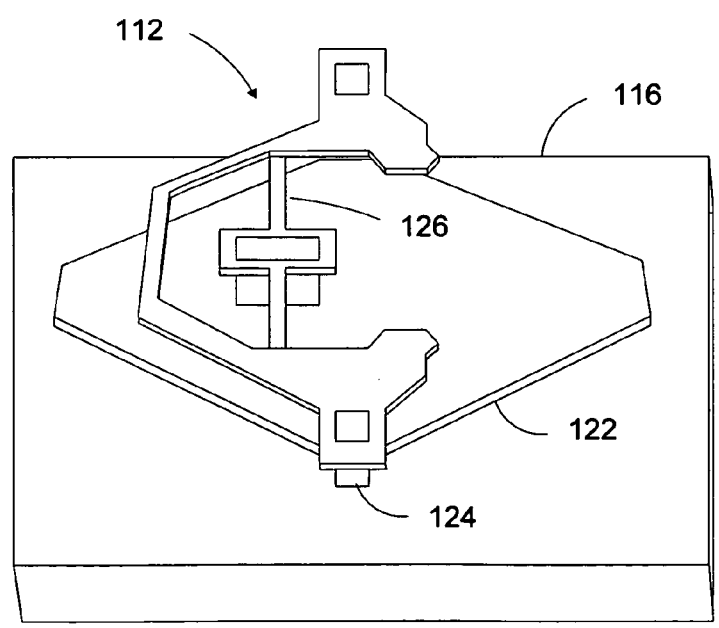
FIG. 3 is a perspective view of an exemplary micromirror device of the micromirror array in FIG. 2.

The micromirrors of the micromirror array may take any desired shapes and configurations. An exemplary micromirror of the micromirror array is illustrated in FIG. 3. Referring to FIG. 3, the micromirror comprises hinge 126 that is held by two posts 124 on glass substrate 116. A reflective mirror plate 122 is attached to the hinge such that the mirror plate is operable to rotate relative to the glass substrate in response to the electrostatic field established between the mirror plate and the electrode (not shown) associated with the mirror plate. In this particular example, the mirror plate is attached to the hinge such that the mirror plate can rotate asymmetrically—that is the mirror plate can rotate to a larger angle in one direction than in the opposite direction. This asymmetric rotation is achieved by attaching the mirror plate to the hinge such that the attachment point is neither along a diagonal of the minor plate nor at the center of the mirror plate. Moreover, the hinge is disposed such that the hinge is parallel to but offset from a diagonal of the mirror plate when viewed from the top. In fact, other configurations can be employed. For example, the mirror plate can be any other desired shape. The hinge and the mirror plate can be arranged such that the mirror plate rotates symmetrically in both directions.

Figure 4A:
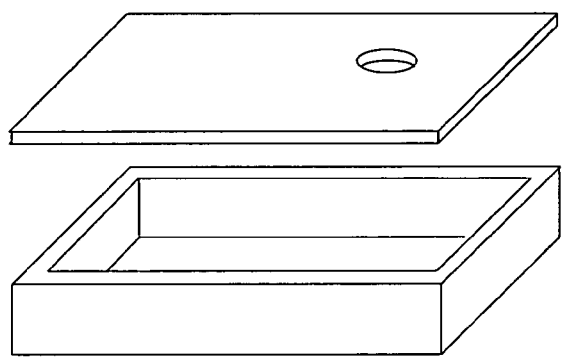
FIG. 4A is an exemplary container containing a lubricant.

The container (110) in FIG. 1 contains a selected lubricant for lubricating the surfaces of the microelectromechanical device. The lubricant evaporates from an opening of the container and contacts the target surface to be lubricated. An exemplary container is illustrated in FIG. 4A. Referring to FIG. 4A, the container has a cavity for containing the lubricant. A container cover may be provided for covering the container. In this situation, an opening is made in the container, such as the container cover as shown in the figure.

Figure 4B:
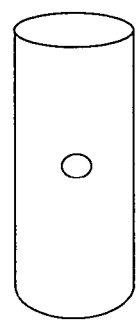
FIG. 4B is another exemplary container containing a lubricant.

Another exemplary container according to the invention is illustrated in FIG. 4B. Referring to FIG. 4B, the container is a cylinder having an opening on one end. Alternatively, the other end of the cylindrical container is open for allowing the lubricant to evaporate outside the container. In addition to the opening on one end or openings on both ends of the cylindrical container, another opening may be formed on the side of the cylindrical container. In fact, if neither end of the container is opened, the opening on the side of the container can be use to release the lubricant. Instead of a cylinder, the container may take other desired shapes, such as polyhedron with an interior cavity for containing the lubricant.

Regardless of the wide variety of containers, the interior volume of the container is generally equal to the desired amount of lubricant because too little lubricant will not prevent stiction, while too much lubricant will create excessive capillary adhesion. As a benefit, the amount of the lubricant introduced onto the surfaces to be lubricated can be precisely controlled. For example, the amount of the lubricant in the container and the interior volume of the container for containing the lubricant are of from 10 pico-liters to 10 micro-liters (or from 30 pico-liters to 2 micro-liters). The volume depends in part upon the surface area to be lubricated.

Figure 4C:
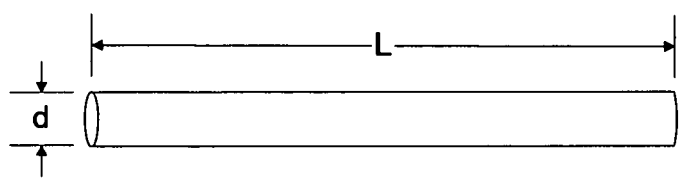
FIG. 4C is an exemplary capillary tubing containing a lubricant.

In order to precisely measure and introduce a small amount of lubricant, such as an amount in the order of micro-liter in volume, onto the target surface, the container can be a capillary tubing as shown in FIG. 4C. Referring to FIG. 4C, the capillary tubing has an interior diameter d of from 2 to 500 micrometers. The length of the capillary tubing can be of a wide range depending upon the desired amount of lubricant with given interior diameter. For example, for a capillary tubing with the interior diameter of from 2 to 500 micrometers, the length can be around 1 centimeter for containing 30 pico-liters to 2 micro-liters of lubricant. If more (or less) lubricant is desired, the length of the capillary tubing can be lengthened (or shortened). Once the capillary tubing is prepared with desired interior volume generally equal to the desired amount of lubricant in volume, the capillary is dipped into a lubricant solution comprising the lubricant. The lubricant solution is then wicked into the capillary tubing by capillary forces.

In filing the capillary tubing with the selected lubricant by dipping an opening end of the capillary tubing into the lubricant solution, lubricant or lubricant solution may adsorb the exterior surface of the capillary tubing. This extra lubricant on the exterior surface will result in excessive capillary adhesion of the surface of the microelectromechanical device. In order to solve this problem, the interior surface of the capillary tubing is desired to be wetted to lubricant, while the exterior surface of the capillary tubing is non-wetting to lubricant. For this and other reasons, the exterior and interior surfaces of the capillary tubing can be coated with suitable coating materials. For example, the interior surface can be coated with a coating material that forms a self-assembly-monolayer on the interior surface. The formed self-assembly-mono-layer presents high adsorbility to the lubricant. The exterior surface of the capillary tubing may be coated with a material that forms a self-assembly-monolayer on the exterior surface of the capillary tubing, while the self-assembly-monolayer presents low adsorbility to the lubricant.

When the capillary tubing with the lubricant is disposed on the package substrate as shown in FIG. 1, the lubricant evaporates from the capillary tubing and contacts the target surface. The evaporation of the lubricant from the container and transportation of the evaporated lubricant onto the target surface can be expedited by heating the container to a temperature of from 30° C. to around 150° C. or higher. In determining the heating temperature, the maximum tolerable temperature of other components of the package, such as the sealing material, need to be considered. Specifically, if the highest tolerable temperature for the sealing material is $T_{max}$ (e.g. 130° C. degrees), the heating temperature of for the container is below $T_{max}$.

In accordance with the invention, the lubricant can be a liquid state at the device operation temperature, such as 50° C. degrees or less, or 70° C. or less. The surface tension of the lubricant on the surface is desired to be low, such as 50 dynes/cm or less, or 20 dynes/cm or less. The lubricant may have a high boiling point (e.g. 100° C. or higher) or low vapor pressure such that the lubricant does not condense at low temperature or fully evaporate at high temperatures (e.g. 30° C. or more, or 70° C. or more, or even 100° C. or more) (the high temperature refer to the storage and operating range of the microelectromechanical device). The lubricant is desired to be stable at a high temperature, such as up to 200° C. The viscosity of the lubricant in liquid phase can be of from 1 cP to 100 cP.

As an example, the lubricant can be perfluoropolyethers with molecular weight of from 500 to 5000. The lubricant can also be perfluorinated hydrocarbons having 20 carbons or less, such as alkanes, amines, alcohols, ethers, triazines and glycols. Other suitable lubricants are also applicable.

The lubricant may be mixed with a diluent (e.g. a solvent) to form a lubricant solution. The lubricant is desired to be in liquid phase at room temperature or higher. For example the boiling point of the lubricant can be 30° C. or higher and/or the melting point is 10° C. or lower. The diluent may have a high vapor pressure at room temperature relative to the lubricant such that it does not condense on the target surface. Moreover, it is desired that the diluent is chemically stable at a temperature of 200° C. or higher. An exemplary diluent is perfluorinated hydrocarbons having 20 carbons or less.

The container having the lubricant can be attached to the package substrate in many ways. As an example, the container can be glued to the package substrate using suitable glues, such as a UV or thermally cured epoxy. The epoxy can be an electrical conductor or electrical insulator. As another example, the container is held by a clip or alike that is fixed to the substrate for holding the container. As yet another example, the container is placed into another cavity other than the cavity in which the microelectromechanical device is disposed on the substrate. The two cavities are connected via a tunnel or a hole with a dimension smaller than the dimension of the container but larger than the size of the lubricant molecular. Consequently, the lubricant vapor can flow through the tunnel or the hole into the cavity having the microelectromechanical device, but the container can not go through. Rather than forming the cavity for the container on the package substrate, such cavity can be formed on the package cover. In this situation, the container having the lubricant can be assembled to the package when the package cover is sealed with the package substrate.

Figure 5:
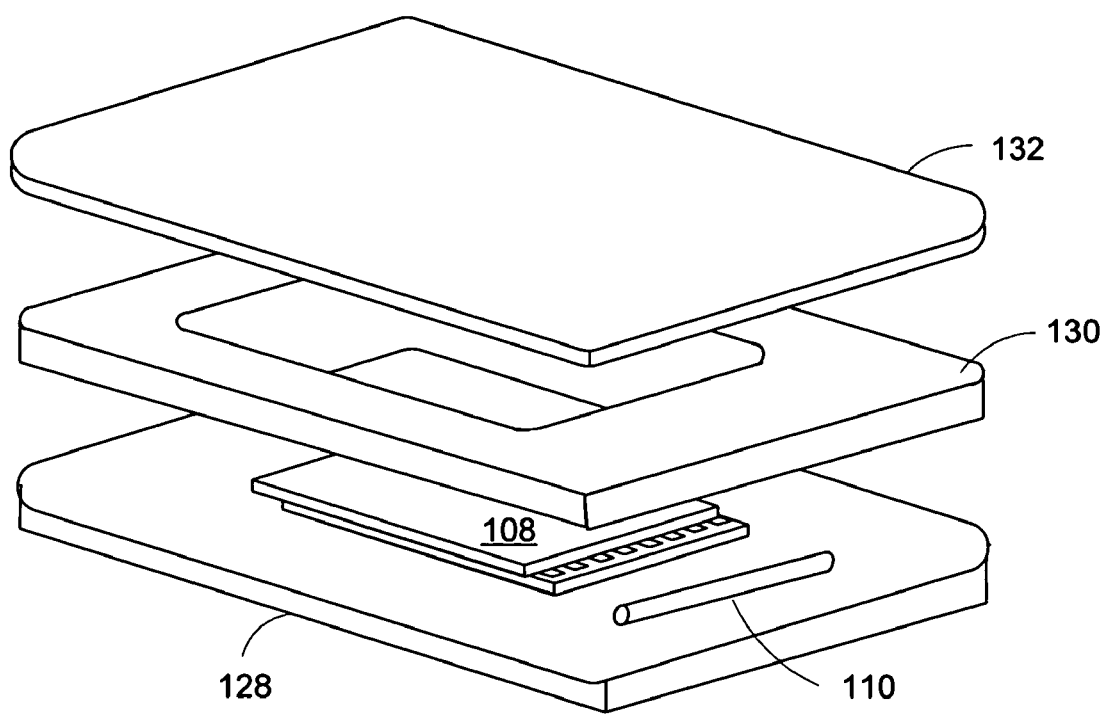
FIG. 5 is a perspective view of another microelectromechanical device package.

The container having the lubricant (or lubricant with diluent) can be disposed in a variety of microelectromechanical device packages. Another exemplary microelectromechanical device package is illustrated in FIG. 5. Referring to FIG. 5, package substrate 128 is a flat substrate. Microelectromechanical device 108 is attached to the package substrate. Container 110 having the lubricant (or a mixture of the lubricant and a diluent) is place close to the microelectromechanical device on substrate 128. Spacer 130 is disposed on the flat substrate 128 so as to form a cavity for accommodating the microelectromechanical device. Package cover 132 is placed on the spacer and the package substrate. The spacer and the package substrate can be bonded and hermetically sealed using proper sealing material and so as the spacer and the package cover.

It will be appreciated by those of skill in the art that a new and useful method and apparatus for lubricating microelectromechanical devices in packages have been described herein. In view of many possible embodiments to which the principles of this invention may be applied, however, it should be recognized that the embodiments described herein with respect to the drawing figures are meant to be illustrative only and should not be taken as limiting the scope of invention. Those of skill in the art will recognize that the illustrated embodiments can be modified in arrangement and detail without departing from the spirit of the invention. Therefore, the invention as described herein contemplates all such embodiments as may come within the scope of the following claims and equivalents thereof.

What is claimed is:

1. A microelectromechanical package, comprising:
    a package substrate;
    a microelectromechanical device having a surface to be lubricated, wherein the microelectromechanical device is disposed on the package substrate;
    a container containing a lubricant that evaporates from an opening of the container and contacts the surface to be lubricated; and
    a package cover that is bonded to the package substrate for sealing the package.

2. The package of claim 1, wherein the container is a capillary tubing.

3. The package of claim 1, wherein the container is a cylinder.

4. The package of claim 2, wherein the microelectromechanical device is a micromirror device.

5. The package of claim 4, wherein the micromirror device comprises a micromirror assembly having two substrates.

6. The package of claim 5, wherein the two substrates are bonded together; and wherein the bonded substrates have an opening between the substrates such that the lubricant flows through the opening and contact the surface to be lubricated between the substrates.

7. The package of claim 6, wherein the one of the two substrates is glass that is transmissive to visible light, and the other one is a standard semiconductor wafer.

8. The package of claim 7, wherein the glass substrate has an array of micromirrors formed thereon.

9. The package of claim 8, wherein said the other substrate has an array of electrodes formed thereon for deflecting the micromirrors.

10. The package of claim 9, wherein the glass substrate having the micromirrors is further to the package substrate than the substrate on which the electrode array is formed.

11. The method of claim 9, wherein the lubricant comprises a perfluoropolyether.

12. The method of claim 11, wherein the perfluoropolyether has a molecular weight of from 500 to 5000.

13. The method of claim 9, wherein the lubricant comprises a perfluorinated hydrocarbon.

14. The method of claim 13, wherein the perfluorinated hydrocarbon comprises 20 carbons or less.

15. The method of claim 14, wherein the perfluorinated hydrocarbon is selected from alkanes, alcohols, ethers and glycols.

16. The method of claim 9, wherein the lubricant comprises a perfluorinated hydrocarbon.

17. The method of claim 9, wherein the lubricant has a melting temperature of around 50° C. or lower.

18. The method of claim 9, wherein the lubricant has a boiling temperature of around 100° C. or higher.

19. The method of claim 9, wherein the lubricant has a surface tension of 20 dynes/cm or lower.

20. The method of claim 9, wherein the lubricant has a viscosity in liquid phase of from 2 to 100 cP.

21. The method of claim 9, wherein the lubricant is mixed with a diluent that comprises: a perfluorinated hydrocarbon.

22. The method of claim 21, wherein the lubricant diluent is liquid at room temperature.

23. The method of claim 21, wherein the lubricant diluent does not decompose at a temperature of 200° C.

24. The package of claim 9, further comprising: a sealing material between the package substrate and the package cover for hermetically sealing the package.

25. The package of claim 9, wherein the capillary tubing has an interior diameter of from 2 to 500 micrometers.

26. The package of claim 9, wherein the capillary tubing has an interior diameter of from 100 to 200 micrometers.

27. The package of claim 9, wherein the amount of the lubricant inside the capillary tubing is determined by an interior volume of the capillary tubing.

28. The package of claim 9, wherein the capillary tubing has an interior volume that generally equals a particular amount of lubricant necessary for lubricating the surface.

29. The package of claim 28, wherein the particular amount of the lubricant is from 10 pl to 10 $\mu$l.

30. The package of claim 29, wherein the particular amount of the lubricant is from 30 pl to 2 $\mu$l.

* * * * *